(12) United States Patent
Lai et al.

(10) Patent No.: US 9,711,799 B1
(45) Date of Patent: Jul. 18, 2017

(54) COPPER FOIL HAVING UNIFORM THICKNESS AND METHODS FOR MANUFACTURING THE COPPER FOIL

(71) Applicant: Chang Chun Petrochemical Co., Ltd., Taipei (TW)

(72) Inventors: Yao-Sheng Lai, Taipei (TW); Kuei-Sen Cheng, Taipei (TW); Jui-Chang Chou, Taipei (TW)

(73) Assignee: Chang Chun Petrochemical Co., Ltd., Taipei (TW)

( * ) Notice: Subject to any disclaimer, the term of this patent is extended or adjusted under 35 U.S.C. 154(b) by 0 days.

(21) Appl. No.: 15/284,011

(22) Filed: Oct. 3, 2016

(51) Int. Cl.
| | |
|---|---|
| *H01M 4/66* | (2006.01) |
| *C25D 5/02* | (2006.01) |
| *C25D 3/38* | (2006.01) |
| *H01M 10/0525* | (2010.01) |
| *H01M 4/587* | (2010.01) |
| *H01M 4/525* | (2010.01) |

(52) U.S. Cl.
CPC .............. *H01M 4/661* (2013.01); *C25D 3/38* (2013.01); *C25D 5/022* (2013.01); *H01M 4/525* (2013.01); *H01M 4/587* (2013.01); *H01M 10/0525* (2013.01); *H01M 2220/30* (2013.01)

(58) Field of Classification Search
CPC .... B23K 35/02; B23K 35/0233; C25D 5/022; C25D 11/022; C25D 3/02; C25D 3/38; C25D 7/0642; C25D 7/0678; C30B 29/605; H01M 4/0438; H01M 4/587; H01M 4/525; H01M 4/661; H01M 10/0525
USPC ............................ 428/606; 205/77, 291, 292
See application file for complete search history.

(56) References Cited

U.S. PATENT DOCUMENTS

2013/0108887 A1* 5/2013 Kim ........................ B32B 15/01
428/606

FOREIGN PATENT DOCUMENTS

CN 103726099 A 4/2014

* cited by examiner

*Primary Examiner* — Anca Eoff
(74) *Attorney, Agent, or Firm* — Polsinelli PC

(57) ABSTRACT

The present disclosure relates to an improved electrodeposited copper foil having uniform thickness and methods for manufacturing the electrodeposited copper foil. The electrodeposited copper foil typically has one to four interfacial lines through the cross-sectional area of the foil and a weight deviation less than 2.0%. The disclosure also relates to a process for making the electrodeposited copper foil that includes the addition of one or more insulative masks to the surface of a dimensionally stable anode. The insulative mask is cut to correspond to areas of variation in electrodeposited copper foil, such that the mask causes interferences with the electrodeposition process to even out the variation.

19 Claims, 6 Drawing Sheets

COPPER FOIL HAVING UNIFORM THICKNESS AND METHODS FOR MANUFACTURING THE COPPER FOIL

FIELD OF THE DISCLOSURE

The present disclosure relates to an improved electrodeposited copper foil having uniform thickness, and to methods for manufacturing the electrodeposited copper foil.

BACKGROUND

Electrodeposited copper foil is used in a variety of products. For example, it is an indispensable part of printed circuit boards. Double-sided glossy copper foil is coated with an electrode active material and used as the negative electrode plate of a lithium ion secondary battery. Many electronic products therefore rely, at least in part, on electrodeposited copper foil.

A typical device for manufacturing an electrodeposited copper foil comprises a metal cathode drum and an insoluble dimensionally stable anode (DSA), the metal cathode drum being rotatable and having a mirror polished surface. The insoluble metal anode is arranged at approximately the lower half of the metal cathode drum and surrounds the metal cathode drum. An electrodeposited copper foil is continuously manufactured with the device by flowing a copper electrolytic solution between the cathode drum and the anode, applying direct current between these to allow copper to be electrodeposited on the cathode drum, and detaching an electrodeposited copper foil from the cathode drum when a predetermined thickness is obtained.

The variation of thickness of the electrodeposited copper foil is determined by a number of variable process parameters. The production efficiency of electrodeposited copper foil, especially ultra-thin copper foil, is reduced by a tendency for the raw foil to tear during the course of the processing. This problem is especially severe when variations of thickness occur in the copper foil. The thin regions of the foil are weaker than the thick regions. Furthermore, variations in thickness lead to other problems such as curling of the copper foil and formation of wrinkles (sometimes referred to as elongation wrinkles). Moreover, use of copper foil having large variations in thickness in electrical devices such as batteries and circuit boards, can reduce the life-span of these devices due to deterioration or failure.

SUMMARY OF THE DISCLOSURE

The present disclosure relates to an improved electrodeposited copper foil having uniform thickness and methods for manufacturing the electrodeposited copper foil. As mention above, the electrodeposited copper foil is manufactured on a rotating cylindrical drum that is partially submerged in a copper-containing electrolytic solution (e.g., an aqueous copper sulfate/sulfuric acid solution). As the drum rotates, a layer of copper is plated onto the outer surface. The layer of copper is then continuously stripped from the drum and rolled. The surface of the drum and the surface of the dimensionally stable anode are not perfectly uniform. Disturbances on the surfaces can be caused, for example by an incomplete polish and/or the build-up of organic/inorganic contamination. Because of the disturbances, the electrodeposition of copper onto the surface of the drum is not uniform. Therefore, the thickness of the electrodeposited copper foil is also not uniform. Electrodeposition only occurs where the drum and the dimensionally stable anode are conductive. Thus, in areas where conductivity is inhibited by disturbances, copper will not continue forming (building) on the surface of the drum.

An electrodeposition is carried out to produce a test copper foil. The test copper foil is used to identify which areas along the drum create thicker regions in the electrodeposited copper foil and which areas result in thinner regions. The thickness profile of the test copper foil is determined. An example of a thickness profile is shown in FIG. 2. Points A, B, C, and D are too thick, and point E is too thin. To reduce or eliminate variations in thickness, one or more insulative masks (or plates) are cut to correspond to the thickness profile. The thickness profile is a representation of the conductivity and plating time that occurs along the length of the drum, and therefore is used as a guide for shaping the one or more insulative masks. For example, the thickness profile shown in FIG. 2 can be used to create the insulative mask shown in FIG. 3.

The insulative mask in FIG. 3 is thicker at points A, B, C, and D, and thinner at point E. This insulative mask is attached to the dimensionally stable anode. The thicker portions of the mask will reduce plating time (cause interference) so that less copper is electrodeposited in the corresponding areas along the drum. Conversely, the thinner portions of the mask will allow more plating time and therefore more copper to form in corresponding areas along the drum. Thus, the "peaks" and "valleys" (or the variations) in the electrodeposited copper foil become minimized or eliminated.

In some cases it is useful to use multiple masks that adjust for the deviations gradually, in a step-wise manner. Using multiple masks decreases the overall impact of any single mask on the deposition process. Multiple masks result in the formation of multiple interfacial lines.

An interfacial line is a line formed at the interface between two different grains of copper. The different grains result from the interference caused by the insulative mask(s) between the cathode drum and the dimensionally stable anode. Each insulative mask causes a disturbance between the drum and the dimensionally stable anode. The growth of the copper grain is disturbed and therefore a layer of different grain is formed. The interfacial lines that form in the electrodeposited copper foil can be observed by etching the cross-sectional area along the transverse (TD) direction of the electrodeposited copper foil, which is illustrated in FIG. 6 and FIG. 7.

The electrodeposited copper foil of the instant disclosure typically has one to four interfacial lines through the cross-sectional area of the electrodeposited copper foil. Further, the electrodeposited copper foil typically has a weight deviation less than 2.0%. In some cases, the electrodeposited copper foil comprises 1 to 4 interfacial lines through the cross-sectional area of the foil; a weight deviation less than 2.0%; a deposited side having a surface roughness (Rz) of 2 μm or less; and a tensile strength of 30 kgf/mm$^2$ to 40 kgf/mm$^2$.

The instant disclosure also relates to methods for making the electrodeposited copper foil that includes the addition of one or more insulative masks to the surface of a dimensionally stable anode. The one or more insulative masks are cut to correspond to areas of variation in electrodeposited copper foil, such that the mask causes interferences with the electrodeposition process to even out the variation.

A process for making the electrodeposited copper foil described herein typically includes: preparing a copper sulfate electrolytic solution around at least a portion of a drum that is connected to a negative charge; positioning one or more insulative masks on the surface of a dimensionally stable anode; and performing an electrochemical reaction on the copper sulfate electrolytic solution, thereby obtaining an improved electrodeposited copper foil having uniform thickness.

Finally, the instant disclosure relates to circuit boards and negative electrodes (anodes) comprising the electrodeposited copper foil described herein; batteries (such as lithium ion secondary batteries) comprising a positive electrode (cathode), a negative electrode (the negative electrode comprising the electrodeposited copper foil described herein), and an electrolyte; and electronic devices comprising the batteries and/or circuit boards.

BRIEF DESCRIPTION OF THE DRAWINGS

Implementations of the present technology will now be described, by way of example only, with reference to the attached figures, wherein:

FIG. 6 is a cross-sectional view of an electrodeposited copper foil with interfacial lines across it; and.

Figure 1:
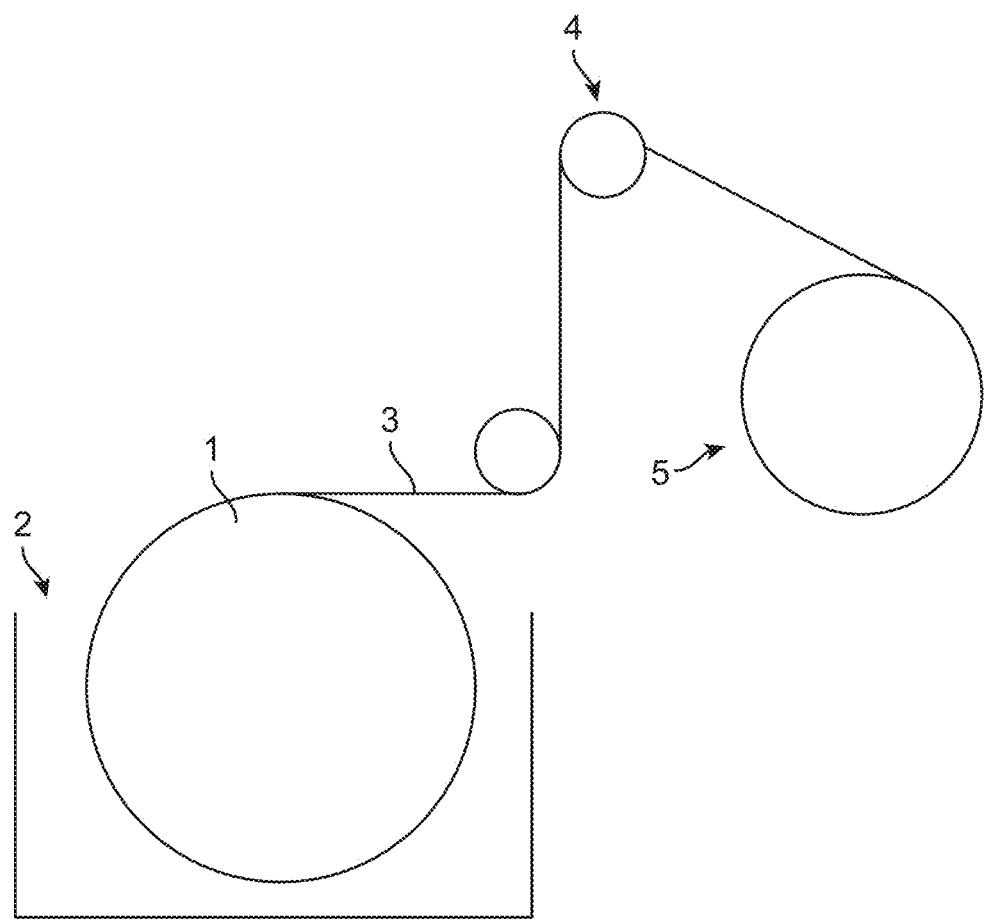
FIG. 1 is a diagram showing a typically manufacturing process for electrodeposited copper foil.

It should be understood that the various aspects are not limited to the arrangements and instrumentality shown in the drawings.

DETAILED DESCRIPTION OF THE DISCLOSURE

The electrodeposited copper foil of the instant disclosure comprises 1 to 4 interfacial lines through the cross-sectional area of the foil, and has a weight deviation of 2.0% or less. In some cases, the electrodeposited copper foil has a weight deviation of less than 1.9, 1.8, 1.7, 1.6, 1.5, 1.4, 1.3, 1.2, 1.1, or 1.0%. Thus, the weight deviation may be from 1.0 to 1.5, 1.6, 1.7, 1.8, 1.9, or 2.0%; or from 1.2 to 1.5, 1.6, 1.7, 1.8, 1.9, or 2%; or from 1.4 to 1.5, 1.6, 1.7, 1.8, 1.9, or 2%; or from about 1.4 to about 1.6%.

The electrodeposited copper foil has a drum side and a deposited side. The side of the electrodeposited copper foil that is in contact with the surface of the titanium drum is referred to as the "drum side," and the opposite side of the electrodeposited copper foil is referred to as the "deposited side (the surface of the electrodeposited copper foil in contact with the copper electrolytic solution)." The deposited side of the electrodeposited copper foil may have a particular roughness. Roughness is a component of surface texture. It is quantified by the deviations in the direction of the normal vector of a real surface from its ideal form. If these deviations are large, the surface is rough; if they are small, the surface is smooth.

Roughness is often reported with Ra or Rz values. The Ra (arithmetical mean roughness) is defined as the arithmetic average value of all absolute distances of the roughness profile from the center line within the measuring length. The Rz (ten points mean roughness) is defined as the average maximum peak to valley height of five consecutive sampling lengths within the measurement length. This value is approximately equivalent to the values of a profile determined from micro-sectioning techniques. A measurement that is often used in regard to high-frequency electrical performance is the Rq value. This is also considered the root mean square (RMS) of the peak-to-valley measurement within the scan region. Historically, the copper-surface roughness has been measured with a physical stylus procedure. This is a well-known test method, but it may report a smoother profile, due to the limitation of the stylus tip in reaching the depth of a valley. There are also laser profilometer measurement methods that are generally regarded as more accurate; however, there are several different technologies and techniques to consider.

Typically, the deposited side of the copper foil has a surface roughness (Rz) of 2 µm or less. In some cases, the deposited side of the copper foil has a surface roughness (Rz) of 1.9, 1.8, 1.7, 1.6, 1.5, or less. For example, the surface roughness (Rz) may be from 0.5 to 1.5, 1.6, 1.7, 1.8, 1.9, or 2 µm; or from 0.8 to 1.5, 1.6, 1.7, 1.8, 1.9, or 2 µm; or from 1 to 1.6, 1.7, 1.8, 1.9, or 2 µm; or from 1.2 to 1.6, 1.7, 1.8, 1.9, or 2 µm; or from 1.4 to 1.6, 1.7, 1.8, 1.9, or 2 µm; or from 1.4 to 1.9 µm; or from about 1.43 to about 1.93 µm.

The thickness uniformity of the electrodeposited copper foil and the manufacturing process for the electrodeposited copper foil influences tensile strength. Tensile strength is the maximum stress that a material can withstand while being stretched or pulled before failing or breaking. Tensile strength is not the same as compressive strength and the values can be quite different. Elongation and tensile strength are measured using IPC-TM-650, and roughness is measured using JIS B 0601-1994.

Typically, the tensile strength of the electrodeposited copper foil of the instant disclosure has a tensile strength of 30 $kgf/mm^2$ to 40 $kgf/mm^2$. In some cases the tensile strength may be more than 30 $kgf/mm^2$ and less than 40 $kgf/mm^2$, for example, from 32 $kgf/mm^2$ to 40 $kgf/mm^2$, or from 30 $kgf/mm^2$ to 38 $kgf/mm^2$. Additionally, the tensile strength may be from 32 $kgf/mm^2$ to 40 $kgf/mm^2$, or any integer between these two values.

The instant disclosure also relates to a negative electrode comprising a negative active material on a negative current collector, wherein the negative current collector comprises an electrodeposited copper foil described herein. Typically, the negative active material layer contains a carbon material. The carbon material may be, for example, selected from the group consisting of non-graphitizing carbon, artificial graphite, coke, graphite, glasslike carbon, carbon fiber, activated carbon, and carbon black. Additionally, the negative active material layer may include a conductive material, a binder, and a non-aqueous solvent. For example, the binder may be, for example, polyvinylidene fluoride (PVDF), Poly(vinylidene fluoride-co-hexafluoropropylene) (PVDF-HFP), polyimide (Pl), or a combination thereof. The non-aqueous solvent may be, for example, 1-methyl-2-pyrrolidone (NMP).

The instant disclosure further relates to a lithium ion secondary battery comprising a positive electrode, a negative electrode as described above, a separator interposed between the positive electrode and negative electrode, and an electrolyte. The positive electrode may include a composite lithium oxide. The lithium ion secondary battery may be used in an electronic device, for example, a power tool, an electric vehicle, a cell phone, a tablet, or a portable electronic device.

The electrodeposited copper foil of the instant disclosure is useful in batteries, electronic devices comprising the batteries, and/or in the electronic devices themselves (not in the battery). For example, the electrodeposited copper foil may be used in electronic devices such as power tools, automobiles, electric vehicles including electric automobiles, cell phones, tablets, other portable electronic devices, etc.

The electrodeposited copper foil of the instant disclosure is also useful in the manufacture of a printed circuit board (PCB). A PCB mechanically supports and electrically connects electronic components using conductive tracks, pads and other features etched from copper sheets laminated onto a non-conductive substrate. Components (e.g., capacitors, resistors or active devices) are typically soldered on the PCB. Advanced PCBs may contain components embedded in the substrate. PCBs can be single sided (one copper layer), double sided (two copper layers) or multi-layer (outer and inner layers). Conductors on different layers are connected with vias. Multi-layer PCBs allow for much higher component density.

The electrodeposited copper foil of the instant disclosure may be manufactured with an electrodeposition process that uses one or more insulative masks or plates. For example, the process may include one or more of the following:

preparing a copper sulfate electrolytic solution around at least a portion of a drum that is connected to a negative charge;

electrodepositing a test copper foil and determining its thickness profile;

preparing one or more insulative masks corresponding to the thickness profile;

positioning the one or more insulative masks on the surface of a dimensionally stable anode;

performing an electrochemical reaction on the copper sulfate electrolytic solution, so as to obtain an electrodeposited copper foil as described herein;

stripping the electrodeposited copper foil from the drum; and winding the electrodeposited copper foil in a roll.

The copper sulfate electrolytic solution around at least a portion of a drum can be a standard, well-known copper sulfate electrolytic solution known in the art. Often, an organic additive (for example, a low-molecular-weight gel (such as gelatin), hydroxyethyl cellulose (HEC) or polyethylene glycol (PEG)) or a sulfur-containing compound having a grain-refining effect (for example, sodium 3-mercaptopropane sulfonate (MPS), bis-(3-soldiumsulfopropyl disulfide) (SPS)) is added to a copper sulfate electrolytic solution to alter the crystalline phase of the electrodeposited copper foil.

FIG. 1 is a diagram showing a typical manufacturing process for electrodeposited copper foil. The foil is electrodeposited on cathode drum 1 in an electrolytic bath 2. Subsequently, the electrodeposited copper foil 3 is fed through a series of rollers 4. Finally, the electrodeposited copper foil is rolled 5. The test copper foil can be generated in this manner. In some cases, post electrodeposition treatment may also be included, for example, nodule layer, anti-tarnish, metal or metal alloy plated or organic treatments may be applied, the electrodeposited copper foil may be cut or sliced, and/or further treated with negative active materials.

The thickness profile of a test copper foil can be determined using X-ray thickness gauge (Futec Accurex, model: PRF7X).

Figure 2:
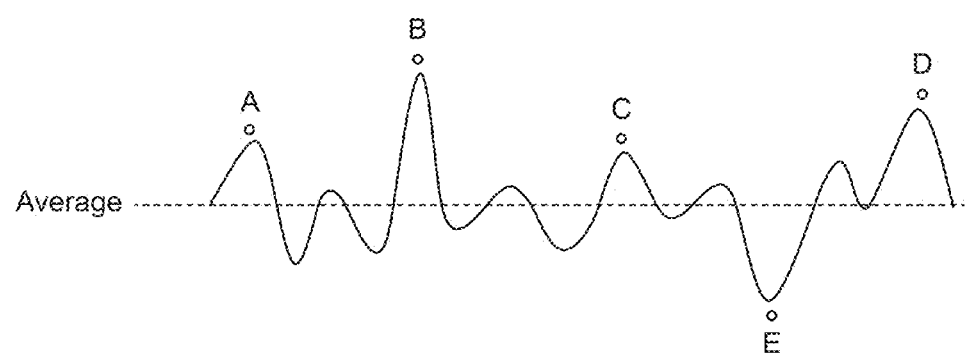
FIG. 2 is an example of a thickness profile of electrodeposited copper foil.
Figure 3:
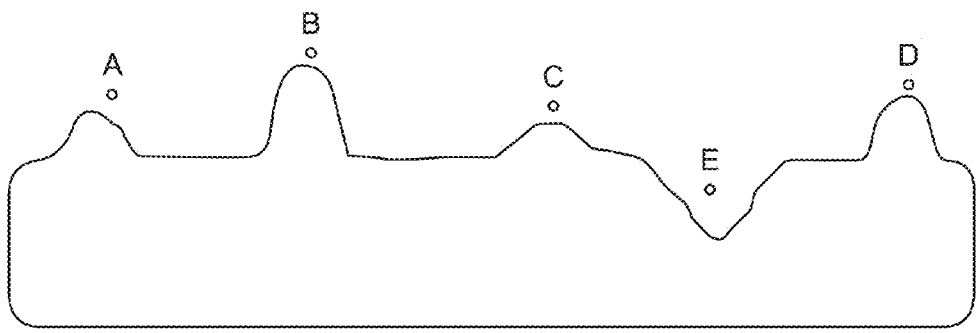
FIG. 3 is a profile of an insulative mask, which corresponds to the thickness profile of the electrodeposited copper foil of FIG. 2.

An example thickness profile is shown in FIG. 2. Points A, B, C, and D represent areas of the electrodeposited copper foil that are too thick, and point E represents an area of the electrodeposited copper foil that is too thin. To reduce or eliminate the deviations in thickness, one or more insulative masks (or plates) are cut to correspond to the thickness profile (because the thickness profile is a representation of the conductivity and plating time along the length of the drum). For example, an insulative mask that corresponds to the thickness profile of FIG. 2 is shown in FIG. 3. The insulative mask is thicker at points A, B, C, and D, and thinner at point E. The thicker portions of the mask reduce plating time (cause interference) in areas along the drum so that less copper is electrodeposited at these areas. Conversely, the thinner portions of the mask will allow more plating time and therefore more copper to form in these areas along the drum. Thus, the "peak" and "valleys" (or the variations) in the copper foil are minimized or eliminated. The one or more insulative masks may be made of, for example, polymers having Tg (glass transition temperature) over 45° C. such as polyamide, poly(1-chloroethene), polytetrafluoroethene, poly(1-phenylethene), acrylonitrile butadiene styrene, poly(methyl 2-methylpropenoate), polybutylene terephthalate, polyethylene terephthalate, polypropylene terephthalate, polycarbonate, polyphenylene oxide, polyphenylene sulfide, polyimide, liquid crystal polymer, polytetrafluoroethylene, polyether ether ketone, polylactic acid, polysulfones, poly ether sulfone, polyetherimide, polyamide-imide and polyacrylonitrile, but not limited to above materials.

The standard insulative material with a size of 1380 mm (width)×200 mm (length)×1 mm (thick) is cut to correspond to the thickness profile of the test copper foil using a coping saw.

The one or more insulative masks are positioned on the surface of a dimensionally stable anode. In some instances, the one or more insulative mask covers from 3 to 20% of the dimensionally stable anode. If the area covered by the insulative mask(s) is too small, the influence of the insulative mask(s) is insufficient to make a significant adjustment to the thickness of the electrodeposited copper foil. On the other hand, if the one or more insulative masks cover too much area of the dimensionally stable anode, this leads to higher current density due to the lower conductive area (current density=(current/conductive area of anode)). Higher current density causes higher surface roughness.

The number of insulative masks corresponds to the number of interfacial lines. Although multiple masks can be effective for refining the thickness of the electrodeposited copper foil, too many interfacial lines may affect the strength of the electrodeposited copper foil and thus reduce tensile strength. Therefore, the number of masks (and thus the number of interfacial lines) is typically from 1 to 4, but in some cases can include more than 4. For example, the number of masks (and thus the number of interfacial lines) may be from 1 to 8; or from 1 to 5, 6, or 7.

As mentioned above, the surface-treated copper foil is particularly useful for use as a negative current collector. Often, the copper foil is coated on one or both sides with a negative active material (or just "active material"). The active material may form one or more layers on or around the negative current collector and often contains carbon material. In such cases, the active material is sometimes referred to as a "carbonaceous material." The negative current collectors are suitable for use in lithium ion secondary batteries. These batteries typically include a positive electrode (cathode), a negative electrode (anode) capable of absorbing and desorbing lithium ions, a separator interposed between the positive electrode and the negative electrode, and an electrolyte.

With respect to the structure or type of the secondary battery in which the electrodeposited copper foil of the instant disclosure may be incorporated, there is no particular limitation, and the secondary battery may be of a stack type including a negative electrode and a positive electrode stacked through a separator, or a spirally wound type including a continuous electrode and a separator spirally wound together. With respect to the form of the secondary battery, there is no particular limitation, and the secondary battery may be of a cylinder type widely used in laptop personal computer (PC) and the like, a rectangle type (rectangular cylinder type) used in portable phone, a button type, or a coin type. As a packaging material for the secondary battery, a typical aluminum can, stainless steel can, laminated film, or others can be used.

Figure 4:
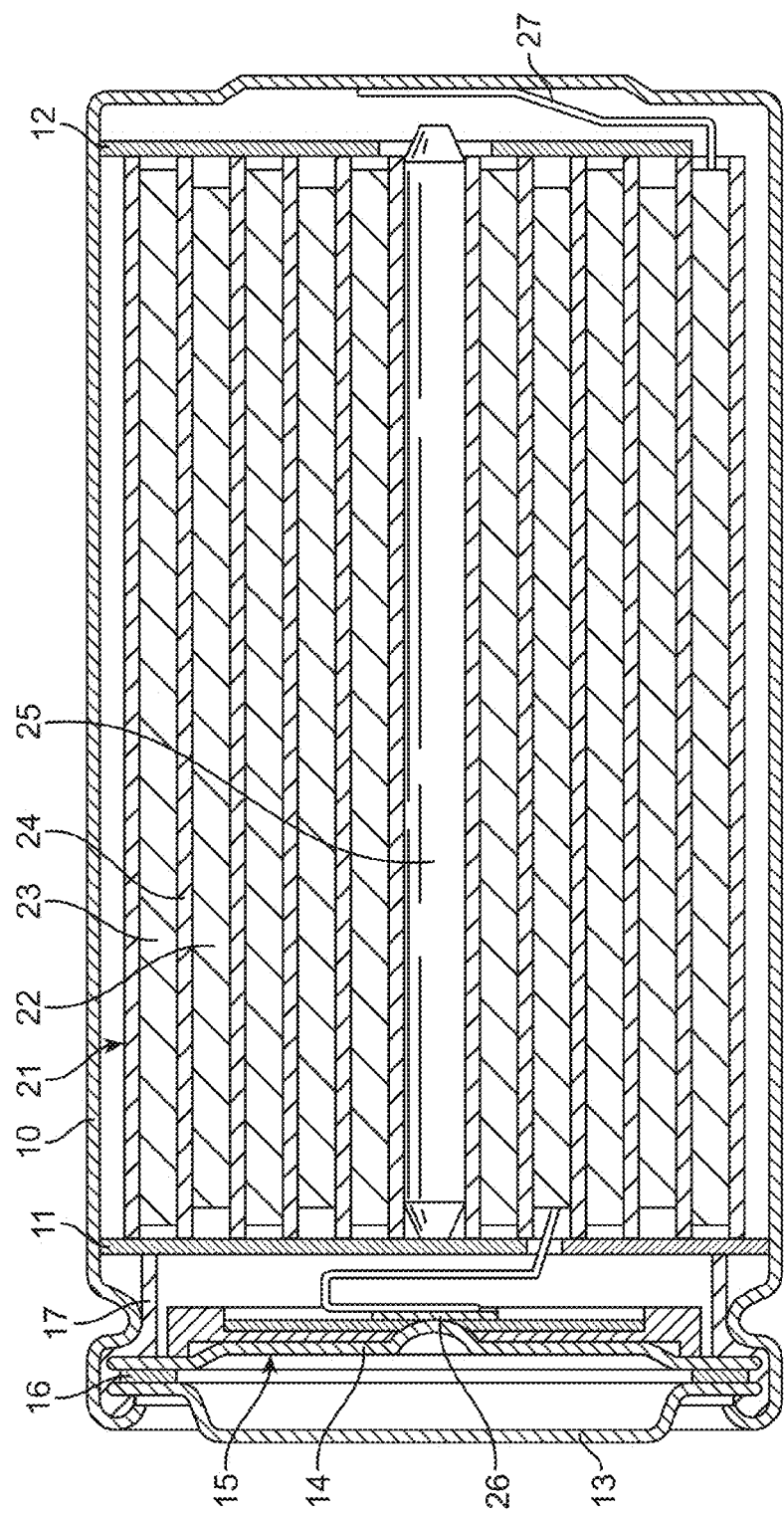
FIG. 4 is a cross-sectional view of a non-aqueous electrolyte lithium-ion secondary battery.

FIG. 4 shows the cross sectional structure of secondary battery of the cylindrical type. In a battery can 10 having a substantially hollow cylindrical column shape, a rolled electrode body 21 obtained by rolling a band-shaped positive electrode 22 and negative electrode 23 with a separator 24 in-between is provided. The battery can 10 is made of, for example, iron (Fe) plated with nickel (Ni). One end of the battery can 10 is closed and the other end is open. A pair of insulating plates 11 and 12 is placed vertical to the peripheral face of the roll so as to sandwich the rolled electrode body 21.

A battery cover 13, and a safety valve mechanism 15 and a PTC (positive temperature coefficient) device 16 which are provided inside the battery cover 13 are attached to the open end of the battery can 10 by being, caulked through a gasket 17, and the battery can 10 is sealed. The battery cover 13 is made of, for example, a material similar to that of the battery can 10. The safety valve mechanism 15 is electrically connected to the battery cover 13 through PTC device 16. When an internal short circuit occurs or the internal pressure of the battery increases to a predetermined value or higher due to heating from outside or the like, a disk plate 14 is turned upside down, thereby disconnecting the electrical connection between the battery cover 13 and the rolled electrode body 21. The PTC device 16 is used to limit a current by an increase in resistance value when the temperature rises to thereby prevent abnormal heating caused by a heavy current. The PTC device 16 is made of, for example, barium titanate based semiconductor ceramics, mixture conductive particle and polymer material. The gasket 17 is made of, for example, an insulating material and asphalt is applied thereon.

The rolled electrode body 21 is rolled around, for example, a center mandrel 25 as a center. A positive electrode lead 26 made of aluminum A) is connected to the positive electrode 22 and a negative electrode lead 27 made of nickel (Ni) is connected to the negative electrode 23. The positive electrode lead 26 is electrically connected to the battery cover 13 by being welded to the safety valve mechanism 15 while the negative electrode lead 27 is electrically connected to the battery can 10 by being welded.

The positive electrode 22 is composed of, for example, a positive electrode mixture layer and a positive electrode collector layer in a structure that the positive electrode mixture layer is provided on one side or both sides of the positive electrode collector layer. The positive electrode collector layer is made of, for example, metallic foil such as aluminum foil, nickel foil, or stainless foil. The positive electrode mixture layer contains, for example, manganese-contained complex oxide and nickel-contained complex oxide as will be described hereinafter, and further contains a conductive material such as graphite and a binder such as polyvinylidene fluoride when necessary.

The negative electrode 23 has a structure in which, for example, a negative electrode mixture layer is provided on one or both sides of a negative electrode collector layer like the positive electrode 22. The negative electrode collector layer is formed of copper foil according to the instant disclosure. The negative electrode can occlude or release lithium at a potential of, for example, 2 V or less with the lithium metal potential being the standard.

Examples of the material for a negative electrode capable of occluding and releasing lithium are a metal or a semiconductor capable of forming alloy or compound with lithium, and the alloy and compound of these. These materials are preferable since an excellent battery capacity can be obtained. Examples of the metals, the semiconductors, and alloys and compounds of those are magnesium (Mg), boron (B), aluminum (Al), gallium (Ga), indium (In), silicon (Si), germanium (Ge), tin (Sn), lead (Pb), arsenic (As), antimony (Sb), bismuth (Bi), cadmium (Cd), silver (Ag), zinc (Zn), hafnium (Hf), zirconium (Zr), yttrium (Y), and alloys and compounds of these. Other example of the compound of metals and semiconductors capable of forming alloys and compounds with lithium is the ones containing at least one kind of nonmetal element and one kind of 4B-Group element except carbon (C).

Examples of the material for a negative electrode capable of occluding and releasing lithium are carbon materials, metal oxides, and polymer compounds. The carbon materials are most preferable since the materials can obtain an excellent cycle characteristic. Examples of the carbon materials are non-graphitizing carbon, artificial graphite, coke, graphite, glasslike carbon, polymer compound organic compound calcined materials, carbon fiber, activated carbon and carbon black. The coke included pitch coke, needle coke and petroleum coke. The high polymer compound calcined material is a material obtained by calcining a high polymer material such as phenolic resin or furan resin at an appropriate temperature so as to be carbonated. Examples of the metal oxides are iron oxide, ruthenium oxide and molybdenum oxide, and examples of high polymer materials are polyacetylene and polypyrrole.

The separator 24 is formed of, for example, a porous film made of polyolefin-based material such as polypropylene or polyethylene or a porous film made of an inorganic material such as ceramic nonwoven cloth. A structure in which two or more kinds of the porous films are stacked may also be used.

The separator 24 is impregnated with a liquid electrolyte. The electrolyte is obtained by dissolving, for example, lithium salt in a solvent as electrolyte salt. Examples of appropriate non-aqueous solvents are propylene carbonate, ethylene carbonate, diethyl carbonate, dimethyl carbonate, 1,2-dimethoxyethane, 1,2-diethoxyethane, .gamma.-butyrolactone, tetrahydrofuran, 2-methyl tetrahydrofuran, 1,3-dioxolane, 4-methyl-1,3-dioxolane, diethyl ether, sulfolane, methyl sulfolane, acetonitrile, ester propionitrile, anisole ester, acetate ester, ester butyrate and propionate. One of these non-aqueous solvents alone, or two or more kinds are mixed to be used.

Examples of lithium salt are $LiClO_4$, $LiAsF_6$, $LiPF_6$, $LiBF_4$, $LiB(C_6H_5)_4$, $CH_3SO_3Li$, $CF_3SO_3Li$, $LiCl$ and $LiBr$. One of the materials alone, or two or more kinds are mixed to be used.

When the secondary battery is charged, for example, lithium ions are released from the positive electrode 22 and occluded by the negative electrode 23 via the electrolyte with which the separator 24 is impregnated. When the secondary battery is discharged, for example, lithium ions are released from the negative electrode 23 and occluded by the positive electrode 22 via the electrolyte with which the separator 24 is impregnated. The positive electrode 22 is formed containing the manganese-contained complex oxide including the first element, and the nickel-contained complex oxide including the second element so that the battery capacity can be maintained even after preservation at a high temperature, thereby obtaining a high capacity retention ratio. Also, a large discharging energy can be obtained when a high load discharging is performed under the condition of high potential cutoff at, for example, 3.3 V.

Figure 5:
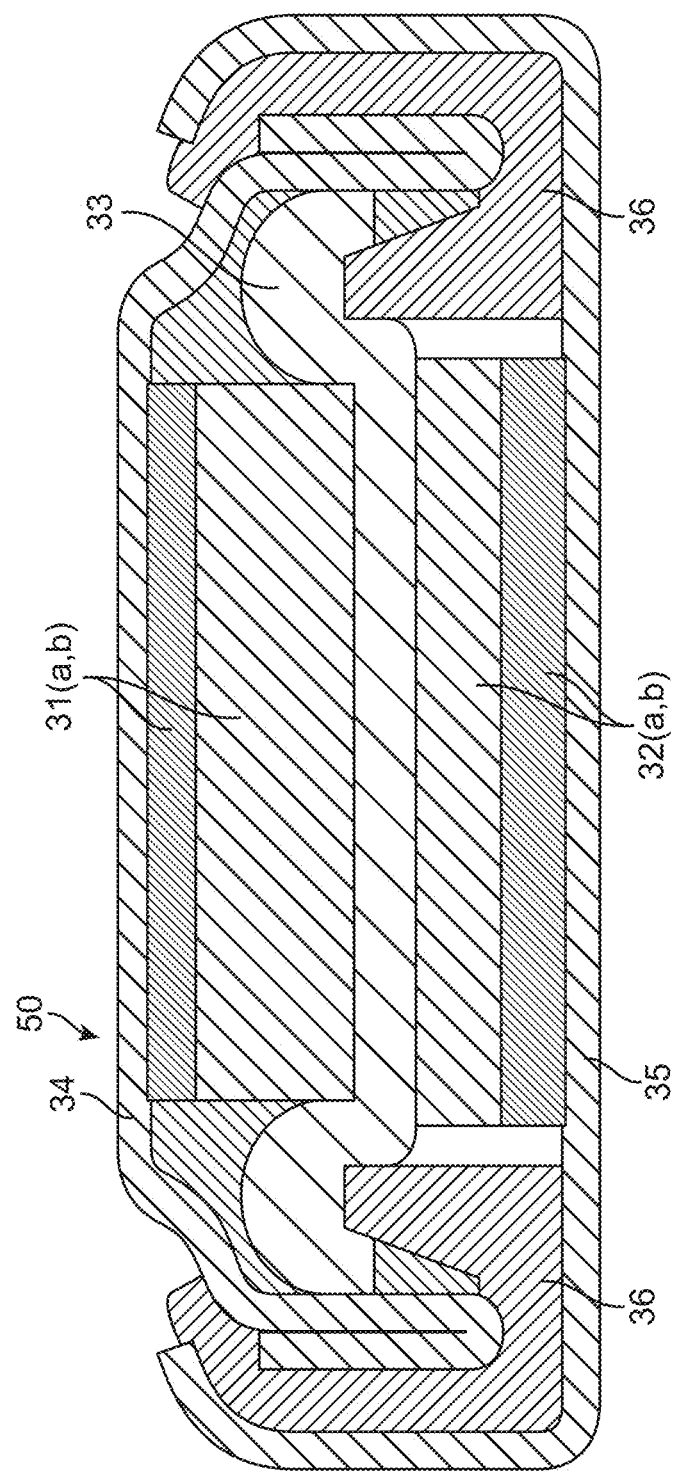
FIG. 5 is a cross-sectional view of a coin type lithium-ion secondary battery.

FIG. 5 is a cross-sectional view showing a coin-type lithium-ion secondary battery. The secondary battery 50 includes a negative electrode 31 contained in a packaging cup 34 and a positive electrode 32 contained in a packaging can 35, which are stacked through a separator 33. The edges of the packaging cup 34 and packaging can 35 are caulked through an insulating gasket 36 to close the battery. Each of the packaging cup 34 and the packaging can 35 is made of a metal, such as stainless steel or aluminum (Al).

The negative electrode current collector 31*a* comprises a copper foil according to the instant disclosure. The copper foil is capable of forming an alloy together with the anode active material layer 31*b*. In this case, the formation of an alloy improves the adhesion between the anode active material layer 31*b* and the negative electrode current collector 31*a*, and hence the anode active material is prevented from being finely divided due to the expansion or shrinkage caused during the charging or discharging, thus preventing the anode active material layer 31*b* from being removed from the negative electrode current collector 31*a*. In addition, there can be obtained an advantage in that the electron conduction of the negative electrode 31 is improved.

The negative electrode current collector 31*a* may be made of either a single layer or a plurality of layers of copper foil. When the negative electrode current collector is made of a plurality of layers, it is preferred that the layer in contact with the anode active material layer 31*b* is made of a metal material capable of forming an alloy together with silicon and the other layer(s) is (are) made of a metal material which does not form an intermetallic compound together with lithium.

The surface of the negative electrode current collector 31*a* on which the anode active material layer 31*b* will be formed may be roughened. The anode active material layer 31*b* contains as an anode active material at least one member selected from a simple substance of silicon and a compound thereof, and a simple substance of tin and a compound thereof, and especially preferably contains silicon. Silicon has both excellent ability to form an alloy together with lithium ions and excellent ability to extract lithium ions from the alloyed lithium, and, when silicon is used for forming a lithium-ion secondary battery, a secondary battery having a large energy density can be achieved. Silicon may be contained in any form of a simple substance, an alloy, a compound, and a mixture thereof.

The anode active material layer 31*b* may be either of a coating type having a thickness of about 70 to 80 μm or of a thin film type having a thickness of about 5 to 6 μm.

The anode active material layer 31*b* of a coating type is formed, on the negative electrode current collector 31*a*, from fine particles of an anode active material made of at least one member selected from a simple substance of silicon and a compound thereof, and a simple substance of tin and a compound thereof, and optionally a conductor, such as a carbon material, and a binder, such as polyimide or polyvinyl fluoride. The anode active material layer 31*b* of a thin film type is formed, on the negative electrode current collector 31*a*, from an anode active material layer 31*b* made of at least one member selected from a simple substance of silicon and a compound thereof, and a simple substance of tin and a compound thereof.

The anode active material layer 31*b* may contain oxygen as a constituent element. Oxygen can suppress expansion and shrinkage of the anode active material layer 31*b* and prevent the lowering of the discharge capacity and the expansion. It is possible that at least part of the oxygen contained in the anode active material layer 31*b* is bonded to silicon, and the silicon bonded may be present in the form of silicon monoxide or silicon dioxide or in another metastable state. In some cases, the oxygen content of the anode active material layer 31*b* is in the range of from 3 to 45 atomic %. The anode active material layer 31*b* may contain at least one constituent element other than silicon and oxygen. Examples of such elements include cobalt (Co), iron (Fe), tin (Sn), nickel (Ni), copper (Cu), manganese (Mn), zinc (Zn), indium (In), silver (Ag), titanium (Ti), germanium (Ge), bismuth (Bi), antimony (Sb), and chromium (Cr).

The positive electrode 32 includes a positive electrode current collector 32*a*, and a cathode active material layer 32*b* formed on the positive electrode current collector 32*a*. The positive electrode current collector 32*a* is typically made of a metal material, such as aluminum, nickel, or stainless steel. The cathode active material layer 2*b* may contain, for example, as a cathode active material, at least one material which is capable of extracting lithium ions during the charging and re-occluding lithium ions during the discharging, and optionally a conductor, such as a carbon material, and a binder, such as polyvinylidene fluoride.

As a material capable of extracting and re-occluding lithium ions, preferred is a lithium-transition metal compound oxide including lithium and a transition metal element M, and being represented by, e.g., the general formula: $Li_xMO_2$. When the lithium-transition metal compound oxide is used in a lithium-ion secondary battery, the oxide can generate high electromotive force, and has a high density and hence can further increase the capacity of the secondary battery. In the above formula, M represents at least one transition metal element, preferably, e.g., at least one element selected from cobalt and nickel, and x varies depending on the charged state (or discharged state) of the battery, and is generally a value in the range of $0.05 \leq x \leq 1.10$. Specific examples of the lithium-transition metal compound oxides include $LiCoO_2$ and $LiNiO_2$.

When a particulate lithium-transition metal compound oxide is used as a cathode active material, either the powder may be used as it is, or at least part of the particulate lithium-transition metal compound oxide may have formed a surface layer including at least one member selected from the group consisting of an oxide having a composition different from that of the lithium-transition metal compound oxide, a halide, a phosphate, and a sulfate. In the latter case, the stability can be improved, making it possible to more surely suppress the lowering of the discharge capacity. In this case, the constituent element of the surface layer and the constituent element of the lithium-transition metal compound oxide may diffuse into each other.

The cathode active material layer 32b may contain at least one member selected from the group consisting of a simple substance and a compound of an element belonging to Group 2, Group 3, or Group 4 of the long-form periodic table. Examples of the elements belonging to Group 2 include magnesium (Mg), calcium (Ca), and strontium (Sr), and magnesium. Examples of the elements belonging to Group 3 include scandium (Sc) and yttrium (Y), and yttrium. Examples of the elements belonging to Group 4 include titanium and zirconium (Zr), and zirconium. The above element may be present either in the form of a solid solution in the cathode active material or in the form of a simple substance or compound at the grain boundary of the cathode active material.

The separator 33 separates the negative electrode 31 from the positive electrode 32 and prevents short-circuiting of current caused due to the contact of these electrodes, and permits lithium ions to pass through it. As a material for the separator 33, for example, a thin membrane of microporous polyethylene or polypropylene having formed therein a number of micropores may be suitable.

The electrolyte includes, for example, a solvent and an electrolyte salt dissolved in the solvent, and may contain an additive if necessary. Examples of solvents used in the electrolyte include non-aqueous solvents, e.g., cyclic carbonates, such as 1,3-dioxolan-2-one (ethylene carbonate; EC) and 4-methyl-1,3-dioxolan-2-one (propylene carbonate; PC), and chain carbonates, such as dimethyl carbonate (DMC), diethyl carbonate (DEC), and ethylmethyl carbonate (EMC). These solvents may be used individually, but the two solvents or more are preferably used in combination. For example, when a high-permittivity solvent, such as ethylene carbonate or propylene carbonate, and a low-viscosity solvent, such as dimethyl carbonate, diethyl carbonate, or ethylmethyl carbonate, are used in combination, high dissolving power for an electrolyte salt and high ion conduction can be achieved. The solvent may contain sultone.

The electrolyte may be either used as it is or used in the form of a so-called gel electrolyte which is made of a polymer compound having the electrolyte. In the latter case, the separator 33 may be impregnated with the electrolyte, or the electrolyte may be present in the form of a layer disposed between the separator 33 and the negative electrode 31 or positive electrode 32. As the polymer material, preferred is, for example, a polymer containing vinylidene fluoride, which has high oxidation-reduction stability. As the polymer compound, preferred is a compound formed by polymerization of a polymerizable compound. Examples of polymerizable compounds include mono-functional acrylates, such as an acrylate; mono-functional methacrylates, such as a methacrylate; polyfunctional acrylates, such as a diacrylate and a triacrylate; polyfunctional methacrylates, such as a dimethacrylate and a trimethacrylate; acrylonitrile; and methacrylonitrile, and, of these, preferred is an ester having an acrylate group or a methacrylate group, which easily undergoes polymerization and has high polymerizable compound reactivity.

Figure 6:
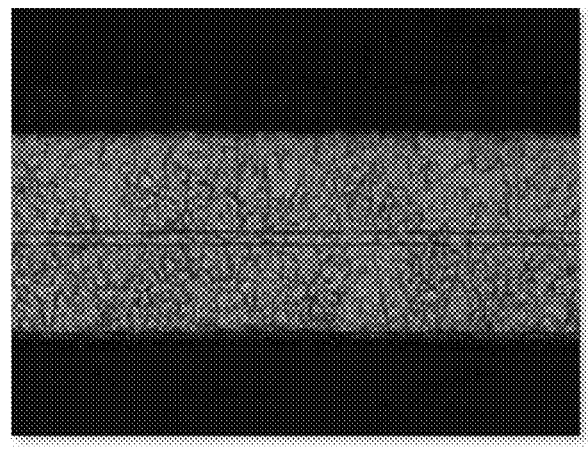
Figure 7:
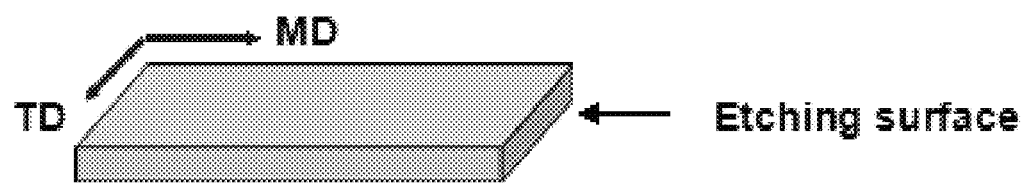
FIG. 7 is a diagram showing that the interfacial lines that form in the electrodeposited copper foil can be observed by etching the cross-sectional area along the TD direction of the electrodeposited copper foil.

FIG. 6 is a cross-sectional view of an electrodeposited copper foil showing the interfacial lines across it and FIG. 7 is a diagram showing that the interfacial lines that form in the foil are observed by etching the cross-sectional area along the transverse direction (TD) direction of the electrodeposited copper foil.

EXAMPLES

Copper wires were dissolved in a 50 wt % sulfuric acid aqueous solution to prepare a copper sulfate electrolyte containing 320 g/l of copper sulfate ($CuSO_4 \cdot 5H_2O$) and 100 g/l of sulfuric acid. To per liter of the copper sulfate electrolyte, 5.31 mg of gelatin (2CP: Koei Chemical Co., Ltd.), 2.89 mg of sodium 3-mercapto-1-propanesulfonate (MPS: HOPAX Company), 0.21 mg of thiourea (Chem-Lab) and 25 mg chloride ion were added. Subsequently, an electrodeposited copper foil with thickness of 12 μm was prepared at the liquid temperature of 45° C. and the current density of 34 $A/dm^2$.

The thickness profile of the electrodeposited copper foil was then determined using an X-ray thickness gauge (Futec Accurex, model: PRF7X).

A variety of insulative masks of differing sizes were then cut to correspond to the thickness profile determine above. The insulative masks were made of poly(1-chloroethene) having a standard size of 1380 mm (width)×200 mm (length)×1 mm (thick) and were cut to correspond to the thickness profile of the test copper foil using a coping saw.

The electrodeposition process discussed above was repeated using various sizes and numbers of masks to generate a variety of electrodeposited copper foils. The results are presented in the table below.

| | Mask area/ Anode area (%) | No. of insulative mask plates | Weight deviation (%) | Rz of deposited side (um) | Tensile strength ($kgf/mm^2$) | No. of interfacial lines |
|---|---|---|---|---|---|---|
| Example 1 | 6 | 1 | 1.4 | 1.43 | 40.6 | 1 |
| Example 2 | 6 | 2 | 1.5 | 1.45 | 37.5 | 2 |
| Example 3 | 9 | 2 | 1.8 | 1.62 | 38.1 | 2 |
| Example 4 | 9 | 3 | 1.6 | 1.64 | 36.2 | 3 |
| Example 5 | 12 | 3 | 1.7 | 1.91 | 35.7 | 3 |
| Example 6 | 12 | 4 | 1.5 | 1.93 | 33.4 | 4 |
| Comp. Example 1 | 0 | 0 | 4.1 | 1.38 | 41.3 | 0 |
| Comp. Example 2 | 3 | 1 | 3.5 | 1.39 | 40.5 | 1 |
| Comp. Example 3 | 3 | 2 | 3.3 | 1.37 | 38.9 | 2 |
| Comp. Example 4 | 15 | 1 | 1.8 | 2.05 | 40.9 | 1 |
| Comp. Example 5 | 15 | 6 | 3.7 | 2.13 | 27.8 | 6 |
| Comp. Example 6 | 18 | 3 | 1.9 | 2.25 | 35.5 | 3 |
| Comp. Example 7 | 18 | 5 | 3.3 | 2.28 | 29.3 | 5 |

Measurements

Weight Deviation:

The electrodeposited copper foil is cut into small pieces of 50 mm in length×50 mm in width. A microbalance (AG-204 type manufactured by Mettler Toledo International Inc.) was used to measure the test pieces. For each test piece, the numerical weight value of the reading was multiplied by 400 to obtain an area weight ($g/m^2$). The weight deviation is defined by ((maximum area weight−minimum area weight)/ average area weight)×100.

$$\text{Weight deviation (\%)} = \frac{\text{Maximum area weight (g/m}^2\text{)} - \text{minimum area weight (g/m}^2\text{)}}{\text{Average area weight (g/m}^2\text{)}} \times 100$$

Tensile Strength:

Tensile Strength was measured according to IPC-TM-650. The electrodeposited copper foil was cut to obtain a test sample in the size of 100 mm×12.7 mm (length×width). The test sample was measured at room temperature (about 25° C.) under the conditions of a chuck distance of 50 mm and a crosshead speed of 50 mm/min by using Model AG-I testing machine of Shimadzu Corporation.

Roughness:

Roughness was measured following JIS B 0601-1994, using an α-type surface roughness and contour measuring instrument manufactured by Kosaka Laboratory Ltd. (Model Type: SE1700). The results are presented as an average of 10 points.

Interfacial Lines:

A test specimen of electrodeposited copper foil was fixed to epoxy resin. A cross-sectional area was polished using an $Al_2O_3$ abrasive stone. 10 ml 25% $NH_4OH$ solution was mixed with 4 ml 30% $H_2O_2$ solution to prepare a developer composition. The developer composition was used to gently wet the surface of the cross-sectional area of specimen. A microscope was used to identify the total number of interfacial lines.

The above embodiments are only used to illustrate the principle of the present disclosure and the effect thereof, and should not be construed as to limit the present disclosure. The above embodiments can be modified and altered by those skilled in the art, without departing from the spirit and scope of the present disclosure. Therefore, the protection scope of the present disclosure is defined in the following appended claims. As long as it does not affect the effects and achievable goals of this disclosure, it should be covered under the technical contents disclosed herein.

The terms "a," "an," and "the" are understood to encompass the plural as well as the singular.

The expression "at least one" means "one or more" and vice versa, and thus includes individual components as well as mixtures/combinations.

The term "about" when referring to a value is meant specifically that a measurement can be rounded to the value using standard convention for rounding numbers. For example, "about 1.5" is 1.45 to 1.54. All values set forth herein can be modified with the term "about," if desired, to impart the meaning above, or recited without the term, regardless of whether the term "about" is specifically set forth (or is absent) in conjunction with any particular value in the specification.

All ranges and values disclosed herein are inclusive and combinable. For example, any value or point described herein that falls within a range described herein can serve as a minimum or maximum value to derive a sub-range, etc.

The invention claimed is:

1. An electrodeposited copper foil comprising:
    (a) 1 to 4 interfacial lines through the cross-sectional area of the foil; and
    (b) a weight deviation less than 2.0%.

2. The electrodeposited copper foil of claim 1, wherein the (b) weight deviation is less than 1.6%.

3. The electrodeposited copper foil of claim 2, wherein the (b) weigh deviation is 1.4 to 1.6%.

4. The electrodeposited copper foil of claim 1, further comprising:
    (c) a deposited side having a surface roughness (Rz) of 2 μm or less.

5. The electrodeposited copper foil of claim 1 comprising a deposited side with a surface roughness (Rz) of 1.43 μm to 1.93 μm.

6. The electrodeposited copper foil of claim 1, further comprising:
    (d) a tensile strength of 30 kgf/mm$^2$ to 40 kgf/mm$^2$.

7. A negative electrode comprising a negative active material layer on a negative current collector, wherein the negative current collector comprises an electrodeposited copper foil of claim 1.

8. The negative electrode of claim 7, wherein the negative active material layer contains carbon material.

9. The negative electrode of claim 8, wherein the carbon material is selected from the group consisting of non-graphitizing carbon, artificial graphite, coke, graphite, glass-like carbon, carbon fiber, activated carbon, and carbon black.

10. A lithium ion secondary battery comprising a positive electrode, the negative electrode according to claim 7, a separator interposed between the positive electrode and negative electrode, and an electrolyte.

11. The lithium ion secondary battery of claim 10, wherein the positive electrode comprises a composite lithium oxide.

12. An electronic device comprising the lithium ion secondary battery of claim 11 selected from the group consisting of a power tool, an electric vehicle, a cell phone, a tablet, and a portable electronic device.

13. A printed circuit board comprising the electrodeposited copper foil according to claim 1.

14. A process for making the electrodeposited copper foil of claim 1 comprising:
    a. preparing a copper sulfate electrolytic solution around at least a portion of a drum that is connected to a negative charge;
    b. positioning one or more insulative masks on the surface of a dimensionally stable anode;
    c. performing an electrochemical reaction on the copper sulfate electrolytic solution, so as to obtain on the drum the electrodeposited copper foil comprising:
        (i) 1 to 4 interfacial lines through the cross-sectional area of the foil; and
        (ii) a weight deviation less than 2.0%.

15. The method of claim 14, wherein the one or more insulative masks cover from 6% to 12% of the area of the dimensionally stable anode.

16. An electrodeposited copper foil comprising:
    (a) 1 to 4 interfacial lines through the cross-sectional area of the foil;
    (b) a weight deviation less than 2.0%;
    (c) a deposited side having a surface roughness (Rz) of 2 μm or less; and
    (d) a tensile strength of 30 kgf/mm$^2$ to 40 kgf/mm$^2$.

17. The electrodeposited copper foil of claim 16, wherein the (b) weight deviation is less than 1.6%.

18. The electrodeposited copper foil of claim 16, wherein the (b) weight deviation is 1.4 to 1.6%.

19. The electrodeposited copper foil of claim 16, wherein the deposited side has a surface roughness (Rz) of 1.43 μm to 1.93 μm.

* * * * *